United States Patent [19]
Sheets, II et al.

[11] Patent Number: 6,043,689
[45] Date of Patent: Mar. 28, 2000

[54] DRIVER CIRCUIT FOR PROVIDING REDUCED AC DEFECTS

[75] Inventors: John Edward Sheets, II, Zumbrota; Robert Russell Williams, Rochester, both of Minn.

[73] Assignee: International Business Machines Corporation, Armonk, N.Y.

[21] Appl. No.: 09/040,069

[22] Filed: Mar. 17, 1998

[51] Int. Cl.[7] ................................................. H02M 7/00
[52] U.S. Cl. .......................................... 327/108; 327/544
[58] Field of Search ..................................... 327/108, 109, 327/112, 544, 436, 437

[56] References Cited

U.S. PATENT DOCUMENTS

| | | | |
|---|---|---|---|
| 4,513,241 | 4/1985 | Bowman | 323/285 |
| 4,958,133 | 9/1990 | Bazes | 330/253 |
| 5,048,633 | 9/1991 | Takehara et al. | 180/197 |
| 5,377,093 | 12/1994 | Lee et al. | 363/97 |
| 5,489,862 | 2/1996 | Risinger et al. | 327/108 |
| 5,798,668 | 8/1998 | George | 327/538 |

*Primary Examiner*—Timothy P. Callahan
*Assistant Examiner*—Linh Nguyen
*Attorney, Agent, or Firm*—Joan Pennington

[57] ABSTRACT

A driver circuit for providing reduced AC defects includes an output driver transistor with an effective compensation resistor coupled to a control input of the output driver transistor. An input signal is coupled to the control input of the output driver transistor through the compensation resistor. A current sensing detector is coupled between the compensation resistor and the control input of the output driver transistor for detecting an AC defect responsive to an applied input signal. A field effect transistor can be used for the current sensing detector. Also a differential amplifier can be used for the current sensing detector for detecting smaller AC defects.

9 Claims, 4 Drawing Sheets

6,043,689

DRIVER CIRCUIT FOR PROVIDING REDUCED AC DEFECTS

FIELD OF THE INVENTION

The present invention relates to driver circuits, and more particularly, to improved driver circuits for providing reduced AC defects.

DESCRIPTION OF THE RELATED ART

In high performance complementary metal oxide semiconductor (CMOS) integrated circuit designs, a need exists to detect small AC defects in off chip driver circuits. Off chip driver devices implemented in field effect transistor (FET) technologies require a substantial amount of gate oxide area for the current drive needed to drive off chip loads at high speed. Pinholes in the gate oxide can cause the gate voltage on the output devices to be less than expected, causing an AC defect. Currently a small number of chips, such as about 1 in 500 chips is rejected in manufacturing, for example through the use of I/O wrap testing, for crude AC defects or greater than 1 nanosecond. Defects less than 1 nanosecond are not currently detectable in manufacturing. Small AC defects occur more frequently than large 1 nanosecond AC defects.

In FIG. 1, there is shown a pulldown portion of a conventional CMOS off chip driver circuit. A predriver consists of a pair of field effect transistors (FETs) P1 and N1 that receive a signal from on-chip and invert it. In practice this driver circuit receives a logical combination of input and tristate disable signals. The inverter output is commonly applied through a resistor, as shown and labeled RCOMP. The series impedance combination of the P-channel field effect transistor (PFET) P1 and the resistor RCOMP determine how fast the output driver device, N-channel field effect transistor (NFET) N2 is turned on. NFET N1 turns the output NFET N2 off, and is often found on the NFET N2 side of the resistor RCOMP as turnoff slew rate control is often not required. Node A is expected to ramp up at a rate determined by the impedance of PFET P1 and the resistor RCOMP and the gate capacitance of NFET N2. Note, however, that if there is a pinhole defect in the gate oxide of NFET N2, a small pinhole or leakage current will flow through PFET P1, the resistor RCOMP, and into the substrate through the defect indicated by the dotted line labeled PINHOLE CURRENT. A pinhole defect is a common FET process defect that results in current between the FET gate and FET body. This defect slows the voltage ramp at node A and causes node A to not reach VDD as a final voltage. This resulting timing defect is typically referred to as an AC defect.

If the defect is gross enough, node A does not drive the gate of NFET N2 to a high enough voltage and the device will fail conventional manufacturing current versus voltage (I versus V) testing. Another possible technique for detecting such gross defects is the Idd testing commonly done with CMOS parts. However, these conventional techniques fail to detect subtle or small AC defects.

A need exists for a mechanism to detect pinhole defects in driver circuits enabling for improved quality control during manufacturing testing so that integrated circuit chips with subtle AC defects are rejected before being installed in a system.

SUMMARY OF THE INVENTION

A principal object of the present invention is to provide an improved driver circuit for providing reduced AC defects. Other objects of the invention are to provide such method and apparatus substantially without negative effects, and that overcome disadvantages of prior art arrangements.

In brief, a driver circuit for providing reduced AC defects includes an output driver transistor with an effective compensation resistor coupled to a control input of the output driver transistor. An input signal is coupled to the control input of the output driver transistor through the compensation resistor and a current sensing detector is coupled between the compensation resistor and the control input of the output driver transistor for detecting an AC defect responsive to an applied input signal.

BRIEF DESCRIPTION OF THE DRAWING

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 2:
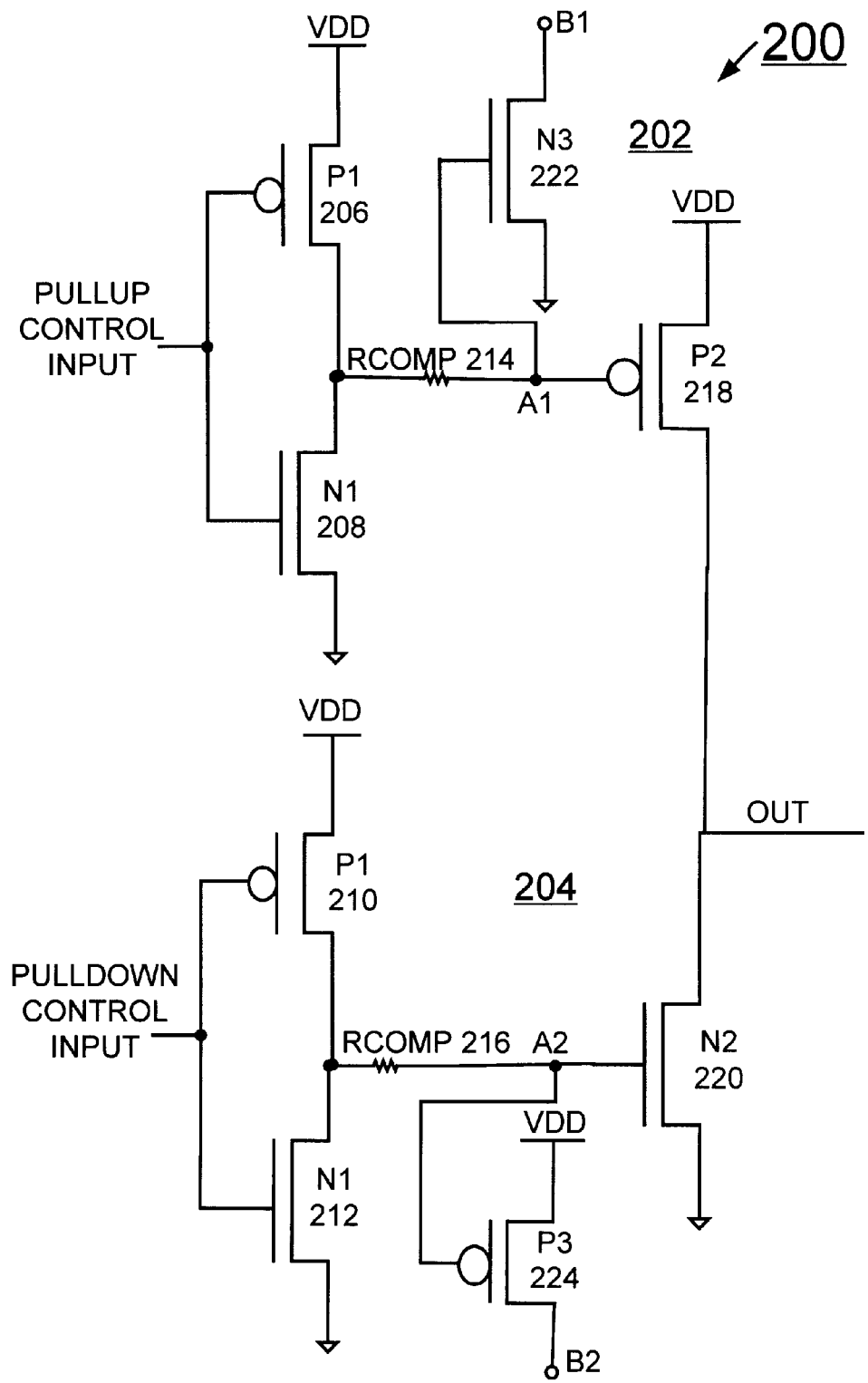
FIG. 2 is a schematic diagram representation of a driver circuit of the preferred embodiment.

Having reference now to the drawings, in FIG. 2 a driver circuit generally designated as 200 of the preferred embodiment is shown. In accordance with features of the invention, driver circuit 200 is arranged to detect pinhole defects so that integrated circuits with subtle AC defects advantageously are rejected in manufacturing. Driver circuit 200 includes a pullup section generally designated as 202 and a pulldown section generally designated as 204. Driver circuit 200 is illustrated in simplified and diagrammatic form sufficient for an understanding of the present invention. The utility of the present invention is not restricted to the details of a particular complementary metal oxide semiconductor (CMOS) integrated circuit product.

Pullup section 202 includes a predriver inverter consisting of a P-channel field effect transistor (PFET) P1 206 and an N-channel field effect transistor (NFET) N1 208 connected in series between a positive rail or supply voltage VDD and a negative rail voltage or ground, as shown. Pulldown section 204 similarly includes a predriver inverter consisting of a P-channel field effect transistor (PFET) P1 210 and an N-channel field effect transistor (NFET) N1 212. Pullup section 202 and pulldown section 204 include a compensation resistor RCOMP 214 and RCOMP 216 respectively connected between the inverter output and a gate input of an output pullup PFET P2 218 and an output pulldown NFET N2 220. Effective compensation resistors RCOMP 214 and RCOMP 216 can be provided either by discrete resistors or resistance provided by the driver FETs N1 208 and P1 210 with appropriate sizing of the driver FETs N1 208 and P1 210. The source of the output pullup PFET P2 218 is connected to the positive rail voltage VDD and its drain is connected to the drain of the output pulldown NFET N2 220.

An on chip signal input, PULLUP CONTROL INPUT applied to the gates of PFET P1 206 and NFET N1 208 is inverted and coupled to the gate labeled node A1 of PFET P2 218 via the compensation resistor RCOMP 214. An on chip signal input, PULLDOWN CONTROL INPUT applied to the gates of PFET P1 210 and NFET N1 212 is inverted and coupled to the gate labeled node A2 of NFET N2 220 via the compensation resistor RCOMP 216.

In accordance with features of the preferred embodiment, a current sensing NFET N3 222 is provided for detecting that node A1 voltage at the gate of PFET P2 218 reaches ground potential, or arbitrarily closely approaches ground potential. In a complimentary fashion, a current sensing PFET P3 224 is provided for detecting if node A2 voltage at the gate of NFET N2 220 reaches the positive rail voltage VDD, or arbitrarily closely approaches VDD. Both current sensing NFET N3 222 and PFET P3 224 advantageously are low threshold $V_T$ devices for fast turn on responsive to leakage current flow in the output driver devices, PFET P2 218, NFET N2 220. An on chip current sensing output labeled as node B1 at the drain of current sensing NFET N3 222 and an on chip current sensing output labeled as node B2 at the drain of current sensing PFET P3 224 respectively provides the AC defect current sensing indication responsive to leakage current flow in PFET P2 218 or NFET N2 220.

The source of NFET N3 222 is connected to the negative rail voltage or ground and its gate is connected to node A1 at the gate of PFET P2 218. With a high input or PULLUP CONTROL INPUT equal to one, node A1 should be "low" or reach the negative supply voltage or ground, and NFET N3 222 should be off. If a pinhole exists with enough current to drop enough voltage across NFET N1 208 and the resistor RCOMP 214 to exceed the threshold of NFET N3 222, current flows through NFET N3 222. The presence of such current combined with PULLDOWN CONTROL INPUT equal to one logically is used to reject the driver circuit 200.

In a complimentary fashion, the source of PFET P3 224 is connected to the positive rail voltage VDD and its gate is connected to node A2 at the gate of NFET N2 220. With a low input or PULLDOWN CONTROL INPUT equal to zero, node A2 should be "high" or reach the positive supply voltage VDD, and PFET P3 224 should be off. If a pinhole exists with enough current to drop enough voltage across PFET P1 210 and the resistor RCOMP 216 to exceed the threshold of PFET P3 224, current flows through PFET P3 224. The presence of such current combined with PULLDOWN CONTROL INPUT equal to zero logically is used to reject the driver circuit 200.

Figure 3:
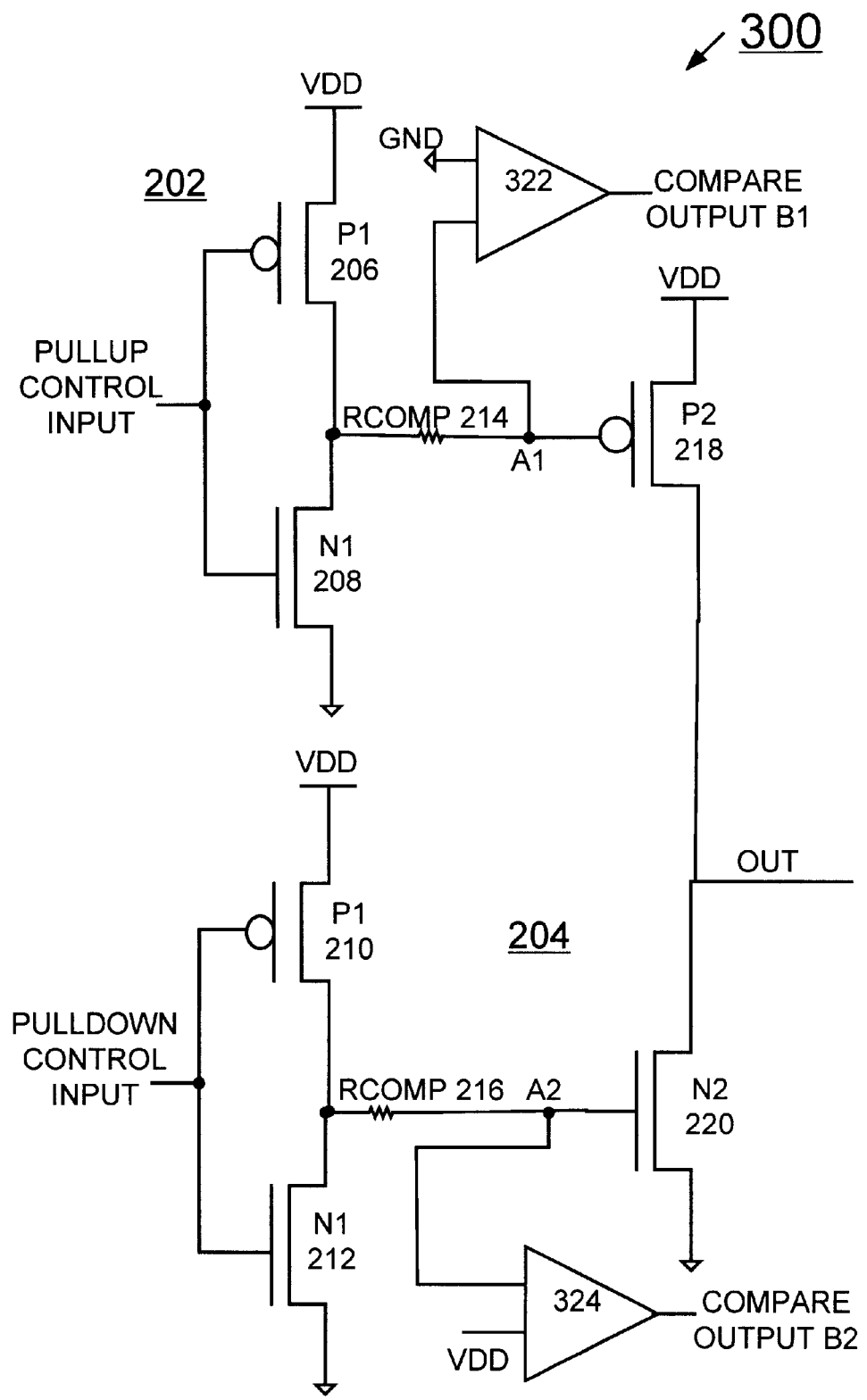
FIG. 3 is a schematic diagram representation of an alternative driver circuit of the preferred embodiment.

In FIG. 3 an alternative driver circuit generally designated as 300 of the preferred embodiment is shown. In accordance with features of the invention, driver circuit 300 is arranged to detect very small pinhole defects than is possible to detect using the NFET N3 222 and PFET P3 224 of driver circuit 200. Very small defects that do not cause enough current flow to turn on NFET N3 222 and PFET P3 224 would not be detected with driver circuit 200. If even more sensitive detection is required, driver circuit 300 advantageously is used. In FIG. 3, the same reference numbers are used for identical components as the driver circuit 200 of FIG. 2.

In driver circuit 300, the NFET N3 222 and PFET P3 224 of driver circuit 200 are replaced with a corresponding pair of differential amplifiers 322 and 324. In the pullup section 202 of driver circuit 300, one input of the differential amplifier 322 is connected to ground and another input is connected to node A1 at the gate of PFET P2 218. In the pulldown section 204 of driver circuit 300, one input of the differential amplifier 324 is connected to the positive rail voltage VDD and another input is connected to node A2 at the gate of NFET N2 220. In the operation of the driver circuit 300, the differential amplifier 322 compares the applied node A1 voltage at the gate of PFET P2 218 with ground potential and provides at its output a COMPARE OUTPUT signal. In complementary fashion, the differential amplifier 324 compares the applied node A2 voltage at the gate of NFET N2 220 with the positive rail potential VDD and provides at its output a COMPARE OUTPUT signal.

Each of the differential amplifiers 322 and 324 advantageously is implemented with a differential amplifier with rail-to-rail common-mode input-voltage range, such as described in "The Journal of Solid-State Circuits", Vol. 26, No 2, February, 1991, page 165 and in U.S. Pat. No. 4,958,133 issued Sep. 18, 1990 and entitled CMOS COMPLEMENTARY SELF-BIASED DIFFERENTIAL AMPLIFIER WITH RAIL-TO-RAIL COMMON-MODE INPUT-VOLTAGE RANGE. The subject matter of the above identified U.S. patent is incorporated herein by reference.

Figure 1:
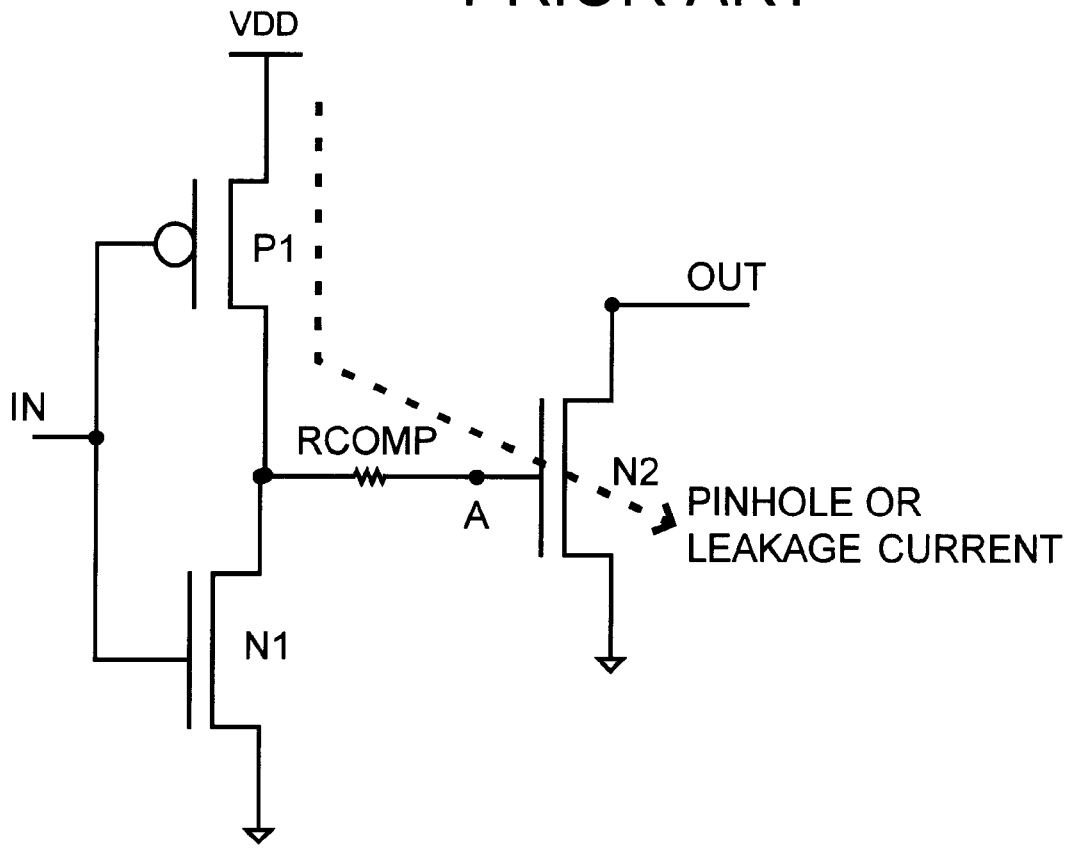
FIG. 1 is a schematic diagram of a conventional driver circuit.
Figure 4:
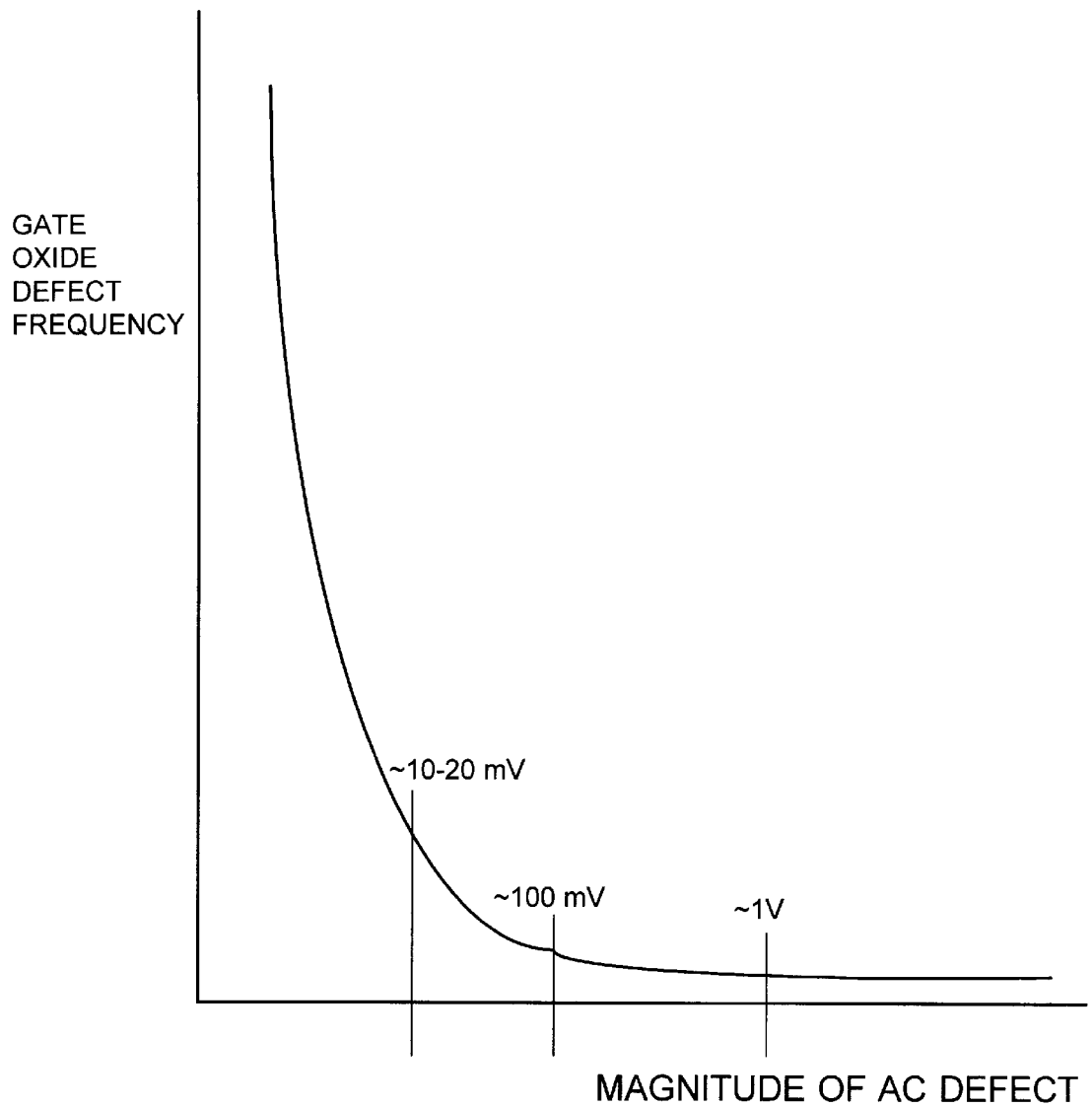
FIG. 4 is a chart illustrating relative gate oxide defect frequency with respect to magnitude of AC defect or gate leakage current along the horizontal axis.

Referring now to FIG. 4, there is shown a chart illustrating relative gate oxide defect frequency with respect to magnitude of AC defect or gate leakage current along the horizontal axis. For example, having reference to FIG. 4, conventional driver arrangements as shown in FIG. 1 can detect AC defects providing a voltage variance from the positive or negative supply rail of about 1 volt or approximately 1 nanosecond delay. Although 1 nanosecond defects may sound small, it should be noted that signals in high performance systems are carefully timed and defects in the order of hundreds of picoseconds are intolerable. Driver circuit 200 of the preferred embodiment can detect AC defects providing a voltage variance from the positive or negative supply rail of about 100 millivolts or approximately 0.1 nanoseconds or 100 picoseconds delay. Driver circuit 300 of the preferred embodiment can detect AC defects providing a voltage variance from the positive or negative supply rail in a range of about 10 to 20 millivolts or approximately 0.01 to 0.02 nanoseconds or 10 to 20 picoseconds delay.

In accordance with features of the preferred embodiment, driver circuits 200 and 300 can detect a subtle AC defect before the integrated circuit chip containing the driver circuit has been put on a card and powered up in a system. Driver circuits 200 and 300 avoid such problems of conventional driver circuits shown in FIG. 1 where AC defects are not discoverable until the integrated circuit chip has been installed on a card and powered up in a system.

While the present invention has been described with reference to the details of the embodiments of the invention shown in the drawing, these details are not intended to limit the scope of the invention as claimed in the appended claims.

What is claimed is:

1. A driver circuit for providing reduced AC defects comprising:

an output driver transistor;

an effective compensation resistor coupled to a control input of said output driver transistor;

an input signal coupled to said control input of said output driver transistor through said compensation resistor;

a current sensor, coupled between said compensation resistor and said control input of said output driver transistor, responsive to said input signal for detecting an AC defect in said output driver transistor; and wherein said output driver transistor comprises an N-channel field effect transistor and said current sensor is responsive to a predetermined voltage offset from a positive supply voltage responsive to said input signal for detecting said AC defect in said output driver N-channel field effect transistor.

2. A driver circuit as recited in claim 1 wherein said current sensor comprises a field effect transistor.

3. A driver circuit as recited in claim 2 wherein said field effect transistor is arranged for detecting AC defects in said output driver transistor including AC defects of approximately 100 picoseconds.

4. A driver circuit as recited in claim 1 wherein said current sensor comprises a differential amplifier.

5. A driver circuit as recited in claim 4 wherein said differential amplifier is arranged for detecting AC defects in said output driver transistor including AC defects in a range of approximately 10 to 20 picoseconds.

6. A driver circuit as recited in claim 1 wherein said control input of said output driver transistor comprises a gate of said N-channel field effect transistor.

7. A driver circuit for providing reduced AC defects comprising:

an output driver transistor;

an effective compensation resistor coupled to a control input of said output driver transistor;

an input signal coupled to said control input of said output driver tr ansistor through said compensation resistor;

a current sensor, coupled between said compensation resistor and said control input of said output driver transistor, responsive to said input signal for detecting an AC defect in said output driver transistor; and wherein said output driver transistor comprises an P-channel field effect transistor and wherein said current sensor is responsive to a predetermined voltage offset from a negative supply voltage responsive to said input signal for detecting said AC defect in said output driver P-channel field effect transistor.

8. A driver circuit as recited in claim 7 wherein said current sensor comprises a field effect transistor.

9. A driver circuit as recited in claim 7 wherein said current sensor comprises a differential amplifier.

* * * * *